United States Patent
Kong et al.

(10) Patent No.: US 10,175,737 B1
(45) Date of Patent: Jan. 8, 2019

(54) MANAGING ELECTRICAL RESILIENCY IN A DATACENTER

(71) Applicant: Amazon Technologies, Inc., Seattle, WA (US)

(72) Inventors: Yuan Kong, Kirkland, WA (US); Frank Andrew Glynn, Redwood City, CA (US); Hoang Pham, Seattle, WA (US); John William Eichelberg, Spokane, WA (US); Christopher M. Ballard, Redwood City, CA (US)

(73) Assignee: Amazon Technologies, Inc., Seattle, WA (US)

( * ) Notice: Subject to any disclaimer, the term of this patent is extended or adjusted under 35 U.S.C. 154(b) by 121 days.

(21) Appl. No.: 14/979,215

(22) Filed: Dec. 22, 2015

(51) Int. Cl.
*G06F 1/00* (2006.01)
*G06F 1/26* (2006.01)
*G06F 1/32* (2006.01)
*G06F 1/30* (2006.01)
*G01R 21/133* (2006.01)

(52) U.S. Cl.
CPC ............ *G06F 1/30* (2013.01); *G01R 21/133* (2013.01); *G06F 1/263* (2013.01)

(58) Field of Classification Search
CPC ........................................................ G06F 1/32
See application file for complete search history.

(56) References Cited

U.S. PATENT DOCUMENTS

| | | | | |
|---|---|---|---|---|
| 5,784,268 A | * | 7/1998 | Steffek | H02M 7/48 307/46 |
| 8,330,297 B2 | * | 12/2012 | Pines | H02J 9/00 307/18 |
| 8,612,060 B2 | * | 12/2013 | Harriman | G06Q 30/0241 700/295 |
| 9,256,263 B1 | * | 2/2016 | Narayanan | G06F 1/30 |
| 9,991,709 B2 | * | 6/2018 | Frampton | H02J 3/14 |
| 2014/0088780 A1 | * | 3/2014 | Chen | G05F 1/66 700/295 |
| 2014/0208129 A1 | | 7/2014 | Morales et al. | |
| 2014/0208130 A1 | | 7/2014 | Morales et al. | |

* cited by examiner

*Primary Examiner* — Mohammed H Rehman
(74) *Attorney, Agent, or Firm* — Seed IP Law Group LLP (57) ABSTRACT

Techniques are described for providing an automatic transfer switch (ATS), such as in a data center, to switch between a primary power system and a reserve power system based on a priority of the computing systems to which the ATS is supplying power. The ATS obtains the priority from a centralized database and obtains an existing load on the reserve power system. If the existing load is too high and the priority of the computing systems coupled to the ATS is too low, then the ATS may not switch to utilizing the reserve power system upon a failure in the primary power system.

21 Claims, 5 Drawing Sheets

MANAGING ELECTRICAL RESILIENCY IN A DATACENTER

BACKGROUND

Organizations such as on-line retailers, Internet service providers, search providers, financial institutions, universities and other computing-intensive organizations often utilize large-scale computing facilities or data centers to conduct computer operations. Such data centers house and accommodate a large amount of computing systems to process, store and exchange data as needed to carry out an organization's operations. Typically, these computing systems are maintained in racks, which provide power, networking and other supporting functionality to each separate computing system within a respective rack. Power is supplied to each rack from a primary power system, such as from a utility power feed entering the data center. Due to an expectation that data centers always be up and running, data centers generally also include a backup or reserve power system that can supply power to the racks and computing systems in case of a failure in the primary power system.

Various problems sometimes exist, however, with the implementation and use of such power systems.

DETAILED DESCRIPTION

Techniques are described for providing a power-switching device that is configurable to manage two or more power system inputs in specified manners, including to select one or zero of the power system inputs from which to supply power to one or more additional devices attached to the power switching device. In at least some embodiments the power switching device may be an automatic transfer switch (ATS) deployed in a data center and configured to determine whether to switch, for computing systems attached to the ATS, between supplying power from a primary power system to supplying power from a reserve power system based at least in part on a priority of the attached computing systems, such as if problems arise in the power supply from the primary power system. Thus, if multiple such ATSes are deployed in a data center to manage power for different computing systems attached to the ATSes, some of the ATSes may—in response to a problem occurring with the primary power system—determine to switch their attached computing systems to use the reserve power system if those attached computing systems have sufficiently high priority, while other of the ATSes may determine to not switch their attached computing systems to use the reserve power system if those attached computing systems do not have sufficiently high priority. At least some of the described techniques may be implemented in at least some embodiments by automated operations of a Power Management System, such as may be executed on each such ATS, or instead may be implemented in other manners in other environments.

An example data center in which the described techniques may be used may include a plurality of computing systems housed by one or more racks, with a primary power system typically supplying sufficient power to the data center for each of the plurality of computing systems, and with the data center also having a reserve power system (e.g., a redundant power system to the primary power system, such as from one or more generators on the premises of the data center). In various embodiments, the reserve power system may be "oversubscribed," such that the total power requirements of computing systems coupled to the reserve power system exceed the capacity of the reserve power system to supply power at any given time. Accordingly, the reserve power system may not be fully redundant to the primary power system. In addition, power from the primary power system and the reserve power system to each of the plurality of computing systems may be controlled by a plurality of ATSes in the data center, such as with one or more computing systems being coupled, connected, or otherwise attached to a power output of each ATS. Each ATS may then detect power failures or events in the primary power system, and determine whether to automatically switch its power being supplied to being from the reserve power system. As noted above, the determination by an ATS of whether to automatically switch its output to being from the reserve power system may be made based at least in part on a determined priority for the devices attached to the ATS, and may optionally in some embodiments and situations be based on one or more additional factors, including an existing load on the reserve power system based on an amount of its power that is already being used by other devices in the data center.

As an illustrative example, an ATS determines a priority of the computing systems that are coupled to and supported by that ATS. The ATS also determines an existing load on the reserve power system (e.g., the amount of power being consumed by computing systems coupled to the reserve power system). The ATS compares the determined priority to the existing load on the reserve power system to determine if the ATS can switch to the reserve power system upon a failure in the primary power system. The ATS dynamically determines whether or not it can utilize the reserve power system as the load on the reserve power system changes. For example, as the load increases, higher priority computing systems are allowed to utilize the reserve power system, but lower priority computing systems are prevented from switching to the reserve power system. As the load decreases, lower-priority computing systems are allowed to utilize the reserve power system along with the higher-priority computing systems. Each ATS determines whether or not to switch to the reserve power system independent of other ATSes in some embodiments, although in other embodiments other determination techniques may be used (e.g., by having multiple ATSes make such determinations in a distributed manner, by having a centralized system make such determinations for multiple ATSes, etc.). Accordingly, the computing devices in a plurality of racks in the data center can be controlled at the rack level or sub-rack level depending on how many and which computing systems are coupled to each separate ATS. In addition, each ATS may periodically determine whether it can utilize the reserve power system prior to a failure event occurring on the primary power system in some embodiments and situations, while in other embodiments and situations, an ATS may determine if it can switch to the reserve power system in response to the detection of a failure event.

In at least some example embodiments discussed herein, the described techniques may be used with computing systems and devices in a data center, such as an online computing-related resource provider, although the described techniques may be used with other types of distributed or shared-computing-resource environments in other embodiments. In addition, while various specific types of computing systems and automatic transfer switches are discussed for the purpose of illustration, it will be appreciated that the described techniques may be used with other types of devices that control the supply of multiple power sources to a plurality of computing systems. Embodiments discussed below are provided for illustrative purposes and are simplified for the sake of brevity, and the inventive techniques may be used in a wide variety of other situations, some of which are discussed below.

Figure 1:
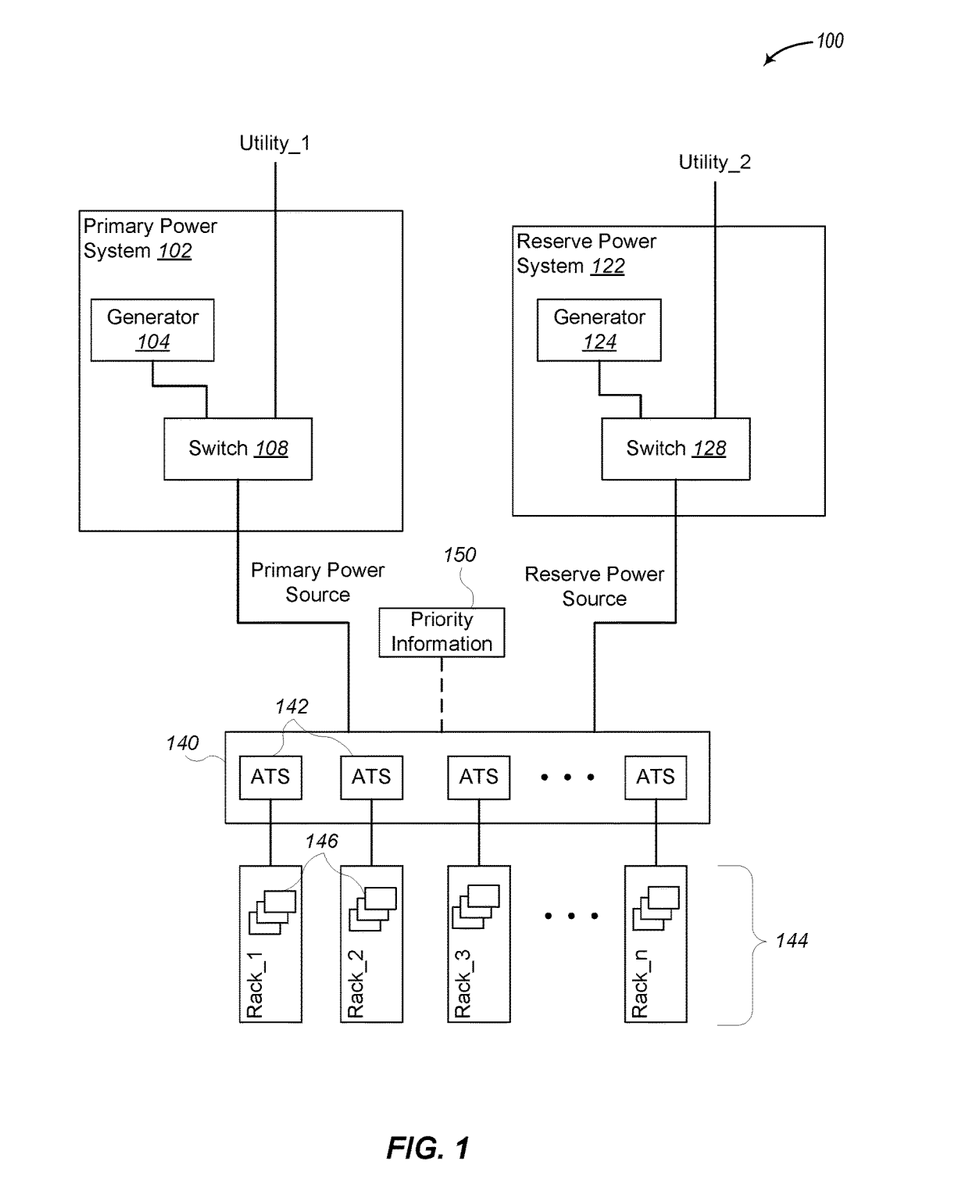
FIG. 1 is a block diagram illustrating an example data center environment having a reserve power system that backs up a primary power system.

FIG. 1 is a block diagram illustrating an example data center environment having a reserve power system that backs up a primary power system. Data center 100 includes a primary power system 102 and a reserve power system 122 to supply power to a plurality of computing systems 146 in racks 144. Data center 100 may also include other primary and reserve power systems (not shown) to supply power for other racks and computing systems that are not shown. The number of separate primary and reserve power systems that a data center has may be dependent on the number of computing systems it houses and the amount of power that a primary power system can supply.

Each of racks 144 house one or more computing systems 146. Each computing system 146 may provide computing resource and perform computing operations (e.g., virtual computer networks, databases, distributed storage systems, other virtual computing resources, or other distributed or on-demand computing resources) for one or more customers or users of the data center 100. Computing systems 146 receive power from and are supported by automatic transfer switches (ATS) 142. Each ATS 142 is coupled, connected, or otherwise electrically attached to and supplies power to one or more computing systems 146 in racks 144. In some embodiments, one ATS may provide power to one rack. In other embodiments, multiple ATSes may provide power to one rack with one or more computing systems in that rack receiving power from one ATS and one or more separate computing systems in that same rack receiving power from a separate ATS. In some embodiments, the computing systems that receive power from an ATS may be referred to supported computing systems of the ATS.

Each ATS 142 may control the selection or switching of input power to supply to computing systems 146 between a primary power source from the primary power system 102 and a reserve power source from the reserve power system 122. Each ATS 142 includes fault detection circuitry that can detect when a fault condition in the primary power source occurs (e.g., a power failure or a power event that could impact the operation of the computing devices 146 that receive power from that ATS). Upon detection of such a fault condition, the ATS can automatically switch power from the primary power system 102 to the reserve power system 122. Similarly, the fault detection circuitry can also detect when the primary power source returns and the ATS can automatically switch power from the reserve power system 122 back to the primary power system 102.

Each ATS 142 determines whether or not to switch from the primary power source to the reserve power source based on a priority of the computing systems coupled to the respective ATS and an existing load on the reserve power system 122. In various embodiments, each ATS 142 receives the priority of its associated computing systems from a priority information system 150. For example, information system 150 may maintain a central database of the priority for each computing system 146 in the data center 100. The information system 150 may also monitor and obtain an existing load on the reserve power system 122, and provide the existing load to ATS 142. As described elsewhere herein, the reserve power system may not be capable of supplying power to each and every computing system 146 in the data center 100. As a results, its load is monitored such that the more loaded the reserve power system 122 becomes, the lower-priority computing systems are prevented from switching to the reserve power system 122 (e.g., upon a fault condition or event with the primary power system 102), while still allowing the higher-priority computing system to switch to the reserve power system 122. In the illustrated example, the dashed line indicates a data connection, whereas the solid lines between components indicate an electrical power connection or coupling.

The priority of the computing systems 146 may be determined based on the impact a power failure would have on those computing systems, the likelihood of a failure occurring, or some combination thereof. In various embodiments, a priority may be determined for each separate computing system. In other embodiments, separate priorities may be determined for each separate group of computing systems, where a group of computing systems includes those computing systems that are supplied power by a common ATS, which is further illustrated in FIG. 2.

The ATSes 142 may be maintained in housing 140. The housing 140 provides the electrical backbone for connecting each ATS 142 to both the primary power system 102 and the reserve power system 122. The housing 140 includes one power input coupled, connected, or otherwise electrically attached to the primary power system 102 and one power input coupled, connected, or otherwise electrically attached to the reserve power system 122. In some embodiments, the ATSes may be located on each rack or within the reserve power system 122, rather than a separate housing. The housing 140 can also provide networking connections for each ATS 142 to connect with and communicate with priority information system 150 or other ATSes 142.

Primary power system 102 is a power system that is capable of supplying sufficient power to handle the total power requirements of each computing system coupled to the primary power system 102. The primary power system 102 receives its primary power through Utility_1. Utility_1 may be a utility feed to the data center or some other main source of power for the data center. The primary power system 102 includes switch 108 and generator 104. Switch 108 selects between power supplied by Utility_1 and generator 104 to be output as the primary power source. Generator 104 may include one or more electrical generators that provide backup power in the event of a power failure to or an insufficient power supply from Utility_1. In some implementations, the primary power system 102 may not include generators, but instead may rely on the reserve power system 122 if there is a failure in the utility external to the data center, which could result in the loss of primary power to data center. The primary power system 102 may also include other components that are not illustrated. For example, the primary power system 102 may include an uninterruptible power supply (UPS) that provides uninterrupted power in the event of a power failure upstream from such a UPS, such as when power switches from Utility_1 to generator 104 during a failure in Utility_1. The UPS can also regulate the primary power source to be a constant voltage. The primary power system 102 may also include power distribution units, transformers, or other electrical power components, which are not illustrated for ease of discussion.

Since many customers of the data center 100 rely on the computing systems in racks 144 being up and running, a constant source of power is important. Although generator 104 provides backup to Utility_1 for the primary power source, there may be situations where generator 104 fails or some other component of the primary power system 102 fails so that the primary power source is no longer available to supply power to the computing systems. Therefore, a reserve power system can provide power for such a situation.

Reserve power system 122 is a redundant power system to back up the primary power system 102. The reserve power system 122 may provide reserve power for all or a portion of the computer systems 146 in racks 144 supplied by primary power system 102. In some embodiments, reserve power system 122 is powered up at all times during operation of data center 100. Reserve power system 122 may be passive until a failure of one or more components of primary power system 102, at which time the reserve power system 122 may become active.

For reserve power system 122 to be completely redundant, it needs to be capable of supplying sufficient power to handle the total power requirements of each computing system coupled to the reserve power system 122—just as the primary power system 102 is capable of powering each computing system coupled to it. But because the likelihood of regularly resorting to the reserve power system 122 is very small, it can be a waste of money and resources for the reserve power system 122 to be completely redundant of the primary power system 102. Accordingly, the reserve power system 122 may be "oversubscribed" such that the total power requirements of computer systems 146 coupled to the reserve power system 122 exceed the capacity of the reserve power system 122 to supply power at any given time. Thus, the reserve power system 122 may be capable of supplying power to only a subset, but not all, of the computer systems 146, which may result in the reserve power system 122 being not fully redundant of the primary power system 102.

The reserve power system 122 receives its primary power through Utility_2. Utility_2 may be a utility feed to the data center or some other main source of power for the data center. In some embodiments, Utility_1 and Utility_2 may be separate utility feeds, or they may be a same utility feed into the data center 100. In other embodiments, the reserve power system 122 may not include a utility feed, but may rely on generators 124. The reserve power system 122 includes switch 128 and generator 124. Switch 128 selects between power supplied by Utility_2 and generator 124 to be output as the reserve power source, which may also be referred to as a secondary or backup power source. Generator 124 may include one or more electrical generators that provide backup power in the event of a power failure to or an insufficient power supply from Utility_2. Generators 104 and 124 may be separate and distinct generators or they may be the same set of generators or a subset of a plurality of generators. The reserve power system 122 may also include other components that are not illustrated. For example, the reserve power system 122 may include a UPS, power distribution units, transformers, or other electrical power components, which are not illustrated for ease of discussion.

Figure 2:
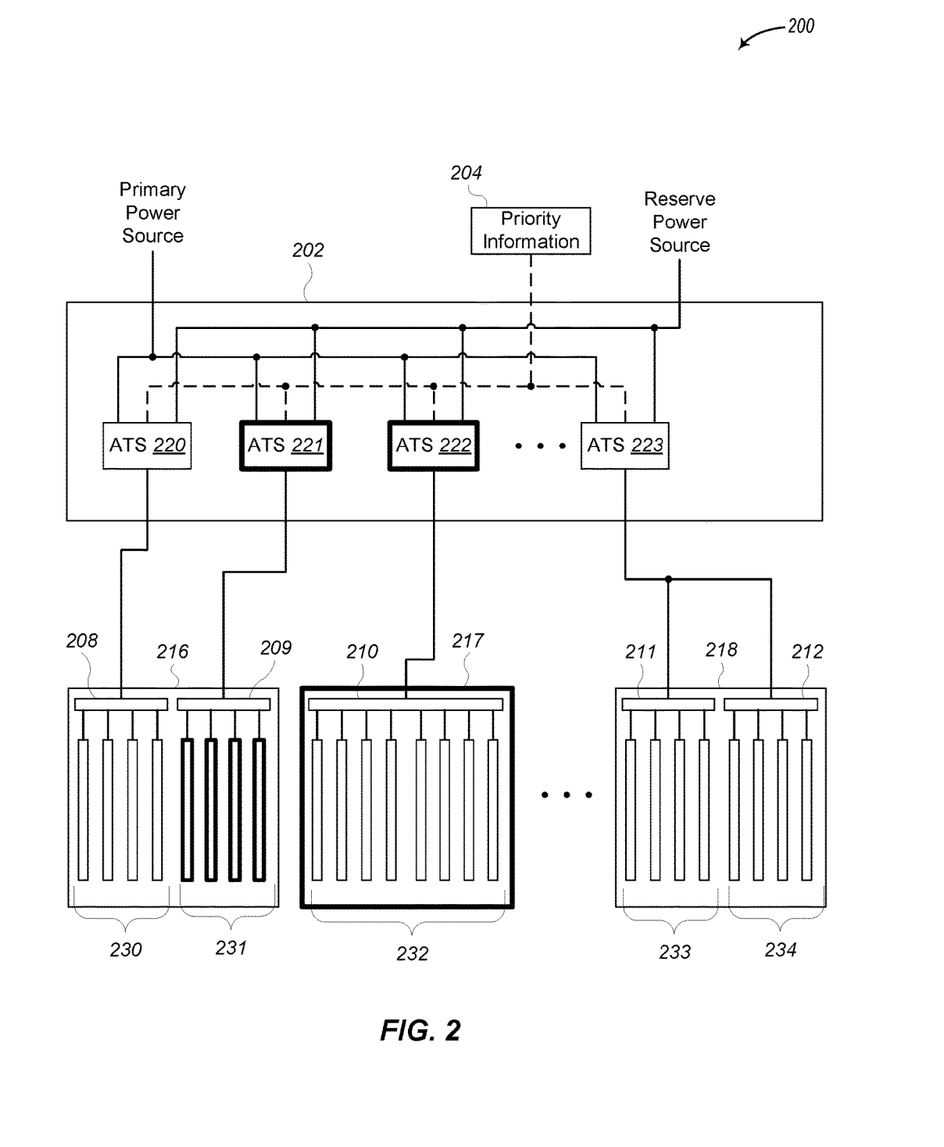
FIG. 2 is a block diagram illustrating an example environment with automatic transfer switches supplying power to computing systems.

FIG. 2 is a block diagram illustrating an example environment with automatic transfer switches supplying power to computing systems. Example 200 includes housing 202 and racks 216-218. Housing 202 is an embodiment of housing 140 in FIG. 1, and racks 216-218 are an embodiment of racks 144 in FIG. 1. Housing 202 includes a plurality of ATSes 220-223. ATSes 220-223 are an embodiment of ATS 142 in FIG. 1. Each ATS supplies power to one or more computing systems 230-234 in racks 216-218. For example, ATS 220 supplies power to computing systems 230 in rack 216, ATS 221 supplies power to computing systems 231 in rack 216, ATS 222 supplies power to computing systems 232 in rack 217 and ATS 223 supplies power to computing systems 233-234.

ATSes 220-223 each include a primary power input to receive power from a primary power source (e.g., from primary power system 102 in FIG. 1) and a reserve power input to receive power from a reserve power source (e.g., from reserve power system 122 in FIG. 1). Each ATS 220-223 also includes a power output that is to supply power to one or more computing systems. In various embodiments, a wire (e.g., a whip) is run from a particular ATS in housing 202 to an outlet or other connector (not illustrated) in the data center.

Racks 216-218 include one or more power distribution units to distribute power to each computing system housed in that rack. For example, racks 216 and 218 each include two power distribution units 208-209 and 211-212, respectively, whereas rack 217 includes a single power distribution unit 210. Each computing system in a rack is coupled to a corresponding power distribution unit to receive power. As illustrated in FIG. 2, computing systems 230 are coupled to power distribution unit 208, computing systems 231 are coupled to power distribution unit 209, computing systems 232 are coupled to power distribution unit 210, computing systems 233 are coupled to power distribution unit 211 and computing systems 234 are coupled to power distribution unit 212. Each power distribution unit is then coupled to a corresponding ATS, such as through a whip. In the illustration, ATS 220 is coupled to power distribution unit 208 to provide power to computing systems 230, ATS 221 is coupled to power distribution unit 209 to provide power to computing systems 231, ATS 222 is coupled to power distribution unit 210 to provide power to computing systems 232 and ATS 223 is coupled to both power distribution units 211 and 212 to provide power to computing systems 233-234. In some embodiments, a computing system may be coupled to an ATS without first coupling to a power distribution unit. In other embodiments, each computing system may include circuitry that provides functionality of an ATS or be a dual corded system that can determine whether to pull power from a secondary power source based on the priority of the computing system and the load on the secondary power source, as described herein.

As described elsewhere herein, each ATS obtains the existing load on the reserve power source and obtains and stores the priority of the computing systems that it supports (e.g., those computing systems that receive power from that respective ATS) from priority information system 204, which is an embodiment of priority information system 150 in FIG. 1. In example 200, ATS 220 obtains the priority of computing systems 230, ATS 221 obtains the priority of computing systems 231, ATS 222 obtains the priority of computing systems 232 and ATS 223 obtains the priority of computing systems 233-234.

By employing embodiments described herein, each ATS can determine whether or not the reserve power source is available to supply power to its supported computing systems upon a power failure condition or event to the primary power source. For example, assume computing systems 231 have a priority level 2 and computing systems 232 have a priority level 5, where level 2 is a higher priority than level 5. The other computing systems also have respective priority levels, but are not discussed here for brevity of the example. ATS 221 and ATS 222 obtain the corresponding priority level of the computing systems that they support from the priority information system 204—in this case, ATS 221 obtains level 2 priority and ATS 222 obtains level 5 priority.

ATS 221 and ATS 222 also obtain the existing load on the reserve power source. In some embodiments, the load information provided to the ATSes may be related to the reserve power source's actual used or available capacity, e.g., the reserve power source is 10% loaded. ATS 221 and ATS 222 can utilize this information and a lookup table or other algorithm to determine if level 2 or level 5 priority computing systems can utilize the reserve power source. In other embodiments, the load information provided to the ATS may be a threshold value from which to compare the priority level. In this way, each ATS does not know the exact load on the reserve power system, but knows how to determine whether it can switch to reserve power or not. For this example, assume the ATSes receive the threshold value for the load on the reserve power source. Next assume the existing load priority threshold is a value of 7.

Each ATS compares the received threshold priority value to the stored priority level of the computing systems that it supports—and if the stored priority is higher than the threshold value, then that ATS can switch to the reserve power source upon a failure. In this example, since priority level 3 and 5 are both above the threshold value 7, ATS 221 and ATS 222 can switch to the reserve power source if there is a failure in the primary power source.

Each ATS may periodically recheck or obtain a new load on the reserve power source. Assume that at a later point in time, each ATS obtains a new load threshold value of 4, e.g., the reserve power system has become more loaded. Again, each ATS compares this threshold priority value to the priority level of the computing systems that it supports and if their priority is higher than the threshold value, then that ATS can switch to the reserve power source upon a failure. In this example, since priority level 3 is above the threshold value 4, ATS 221 can switch to the reserve power source for computing systems 231 if there is a failure in the primary power source, but ATS 222 cannot switch to the reserve power source for computing systems 232 since priority level 5 is below the threshold value 4. In this instance, if there is a power failure in the primary power source, then the ATS 222 may have to power down rack 217 since all of its computing systems 232 are powered by ATS 222.

Now assume that the load threshold value changes to 2 and that computing systems 230 have a priority level of 1. In this instance, since priority levels 3 and 5 are below the threshold value 2, ATS 221 and ATS 222 cannot switch to the reserve power source for computing systems 231 and 232 if there is a failure in the primary power source, but ATS 220 can switch to the reserve power source for computing systems 230 since priority level 1 is above the threshold value 2. Accordingly, if there is a power failure in the primary power source, then the ATS 221 may have to power down computing systems 231 while ATS 220 switches to the reserve power source for computing systems 230. As a result, a portion of rack 216 is being powered, while the other portion is not.

The granularity at which each ATS can supply power to the computing systems in a rack or a data center may be dependent on the number computing systems coupled to each ATS or the number of computing systems coupled to each power distribution unit and the number of power distribution units coupled to each ATS. As illustrated, ATSes 220 and 221 supply power for a partial rack, but ATS 222 supplies power to a full rack. Similarly, even though computing systems 233 and 234 are coupled to different power distribution units 211 and 212, both of those power distribution units are coupled to the same ATS 223. As a result, ATS 223 supplies power to a full rack and cannot control power to computing systems 233 and 234 independently of each other. Accordingly, a single priority for the combined computing systems 223-234 may be determined since they are all supported by a common ATS 223.

Figure 3:
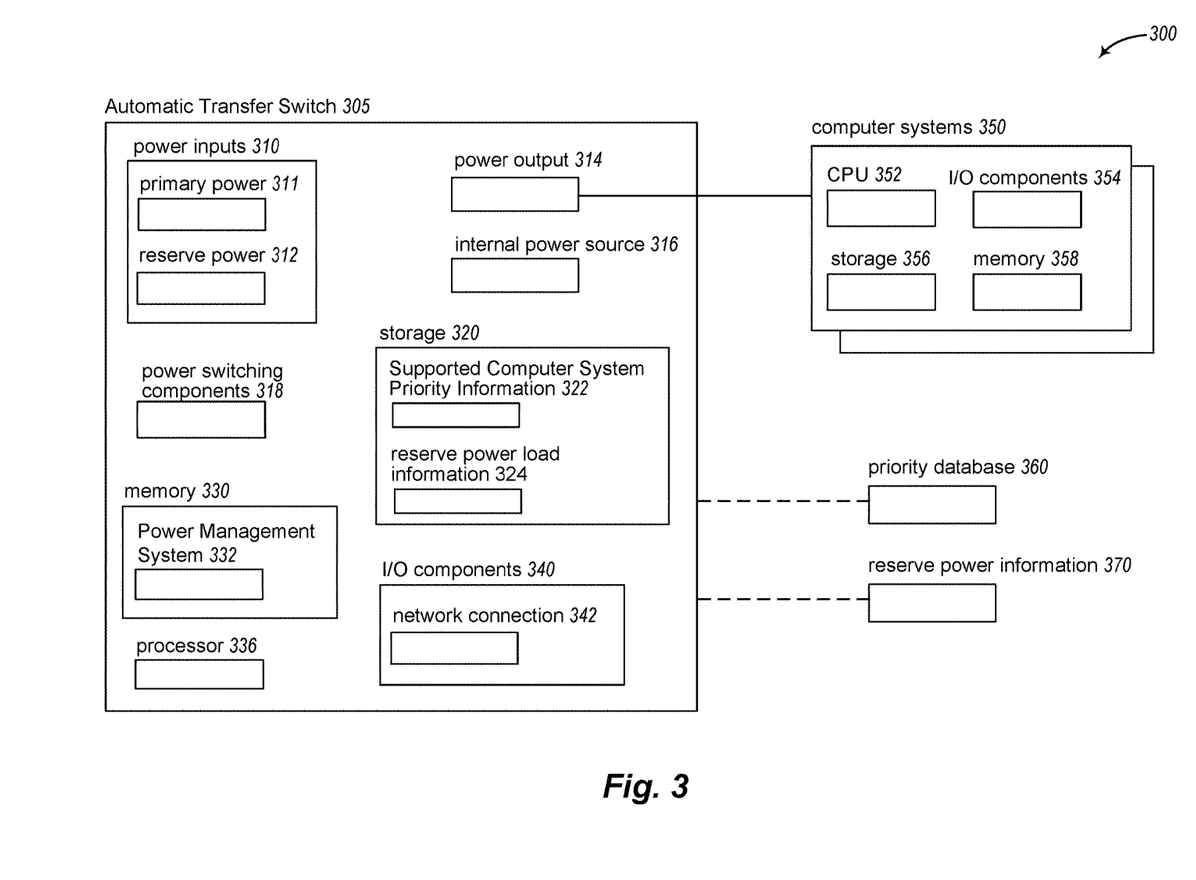
FIG. 3 is a block diagram illustrating an example automatic transfer switch for executing an embodiment of selecting between the primary power system and the reserve power system to supply power to one or more computing systems.

FIG. 3 is a block diagram illustrating an example automatic transfer switch for executing an embodiment of selecting between the primary power system and the reserve power system to supply power to one or more computing systems. In particular, FIG. 3 illustrates example system 300, which includes an automatic transfer switch (ATS) 305, computer systems 350, priority database 360 and reserve power information 370.

The ATS 305 is suitable for performing automated operations to provide at least some of the described techniques, including operating a Power Management System 332 that provides functionality with which at least part of the described techniques can be employed. In the illustrated embodiment, the ATS 305 has components that include power inputs 310, power output 314, internal power source 316, power switching components 318, one or more hardware computer processors 336, various data I/O ("input/output") components 340, storage 320 and memory 330.

The power inputs 310 receive power from multiple power sources and can switch between them if there is a power failure one of the sources. The power inputs 310 include a primary power input 311 that is coupled to a primary power system (e.g., primary power system 102 in FIG. 1) and a reserve power input 312 that is coupled to a reserve power system (e.g., reserve power system 122 in FIG. 1). The power output 314 is capable of supplying power from the power inputs 310 to one or more computer systems 350 coupled to the ATS 305. Internal power source 316 provides power to the ATS 305 to enable the ATS to switch between primary power input 311 and reserve power input 312 without having to rely on an external power source. Power switching components 318 include mechanical relays and power semiconductors that can switch from the primary power input 311 to the reserve power input 312 in the event of a power failure condition or event in a primary power source—and switch from the reserve power input 312 to the primary power input 311 when the primary power source is restored.

Power Management system 332 includes one or more modules stored in memory 330 (e.g., RAM, ROM, or other computer-readable storage medium) to obtain priority information of computer systems 350 from priority database 360 and load information from reserve power information 370, and to determine whether the ATS 305 can switch to the reserve power source coupled to the reserve power input 312 in the event of a power failure in the source coupled to the primary power input 311 based on the obtained load and priority information, as described herein. In various embodiments, Power Management system 332 includes various software instructions that, when executed, program one or more of the processors 336 to provide the described functionality. In various embodiments the described functionality may be employed through specialized circuitry, such as power switching components 318 to determine whether the ATS can switch to reserve power based on the priority of the computing systems supported by the ATS. Various information related to the functionality of the Power Management system 332 may be stored in storage 320 and used during operation, such as, but not limited to, supported computer system priority information 322 (e.g., the obtain priority of the computer systems 350 coupled to power output 314) and reserve power load information 324 (e.g., the obtained existing load on a reserve power system, a priority threshold for switching between power systems, etc.).

The illustrated I/O components 340 include a network connection 342 for communicating with other ATSes, priority database 360 and reserve power information 370. Priority database 360 may store priority information for a plurality of different computing systems or groups of computing systems in a data center, including computer systems 350. Reserve power information 370 may monitor the reserve power system to determine an existing load on the reserve power system. The reserve power information 370 can provide load information to the ATS 305 to enable the ATS 305 to determine if it can switch to reserve power based on the priority of the supported computing systems. Priority database 360 and reserve power information 370 may be embodiments of priority information system 150 in FIG. 1.

In addition, the computer systems 350 may each have one or more CPUs 352, I/O components 354, storage 356 and memory 358, although some details are not illustrated for the computing systems 350 for the sake of brevity.

It should be appreciated that ATS 305 and computing systems are merely illustrative and are not intended to limit the scope of the present disclosure. The computing systems may instead each include multiple interacting computing systems or devices, and the computing systems may be connected to other devices that are not illustrated, including through one or more networks such as the Internet, via the Web, or via private networks (e.g., mobile communication networks, etc.).

It should also be appreciated that, while various items are illustrated as being stored in memory or on storage while being used, these items or portions of them may be transferred between memory and other storage devices for purposes of memory management and data integrity. Alternatively, in other embodiments some or all of the software modules and/or systems may execute in memory on another device and communicate with the illustrated computing systems via inter-computer communication. Thus, in some embodiments, some or all of the described techniques may be performed by hardware means that include one or more processors and/or memory and/or storage when configured by one or more software programs (e.g., by the Power Management system 332) or data structures, such as by execution of software instructions of the one or more software programs and/or by storage of such software instructions and/or data structures. Furthermore, in some embodiments, some or all of the systems or modules may be implemented or provided in other manners, such as by using means that are implemented at least partially or completely in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the modules, systems and data structures may also be stored (e.g., as software instructions or structured data) on a non-transitory computer-readable storage medium, such as a hard disk or flash drive or other non-volatile storage device, volatile or non-volatile memory (e.g., RAM), a network storage device, or a portable media article to be read by an appropriate drive (e.g., a DVD disk, a CD disk, an optical disk, etc.) or via an appropriate connection. The systems, modules and data structures may also in some embodiments be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). Such computer program products may also take other forms in other embodiments. Accordingly, at least some embodiments of the present disclosure may be practiced with other computer system configurations.

Figure 4A:
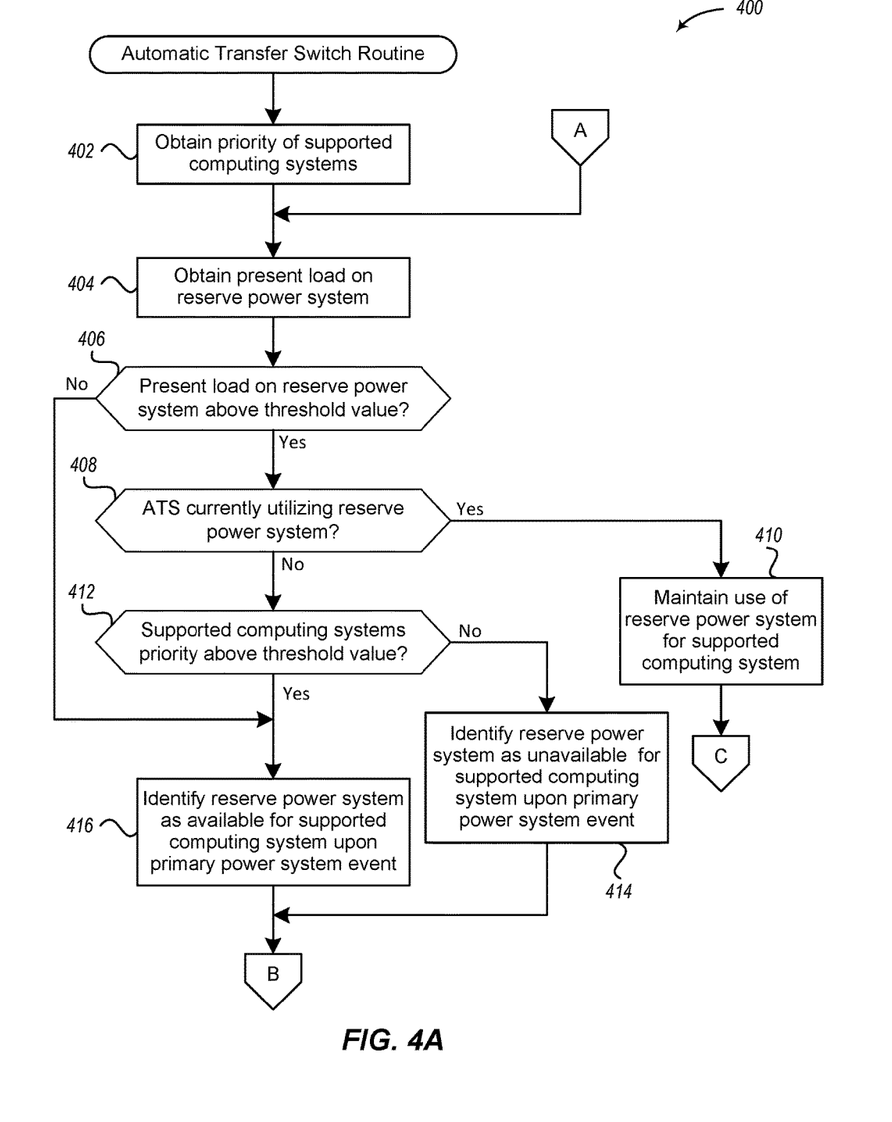
FIGS. 4A-4B illustrate a flow diagram of an example embodiment of an Automatic Transfer Switch routine.
Figure 4B:
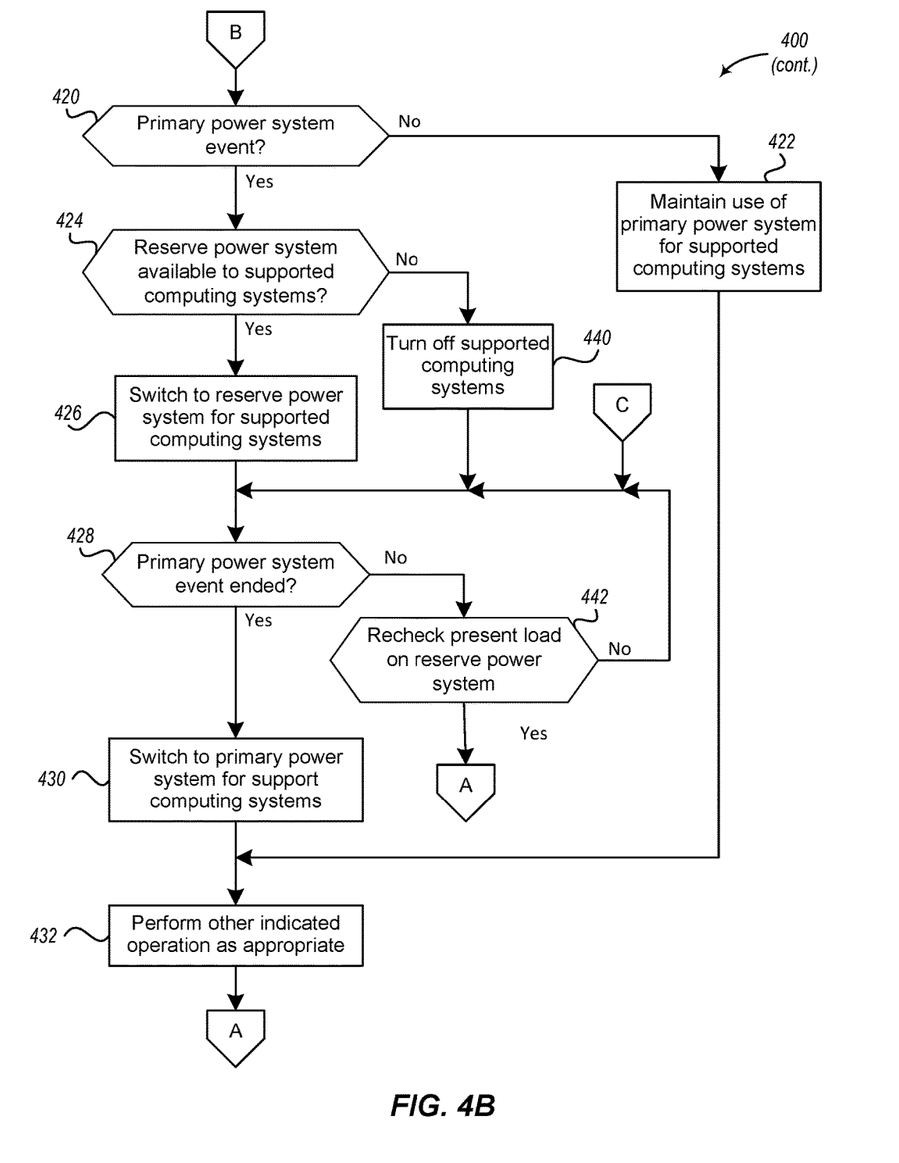

FIGS. 4A-4B illustrate a flow diagram of an example embodiment of an Automatic Transfer Switch routine. The routine 400 may be provided by, for example, execution of the Power Management System 332 of FIG. 3 or otherwise by an automatic transfer switch as discussed herein, such as to perform the described techniques for determining when an ATS can switch to a reserve power system based on a priority of computing devices for which the ATS is supplying power. While the described techniques for switching between primary power and reserve power are discussed in this example as being used in a data center, it will be appreciated that such functionality may be provided by other systems and environments that supply primary and reserve power to a plurality of separate computing systems.

In the illustrated embodiment of FIG. 4A, the routine 400 beings in block 402, to obtain priority of computing systems that are supported by the ATS. In various embodiments, the supported computing systems are those computing systems that are electronically coupled to the ATS to receive power from the ATS. In various embodiments, there may be wires, power cables, switches, power distribution units or other connectors between the ATS and the supported computing systems. Computing systems or groups of supported computing systems may be given a priority by a data center administrator based on an impact a power failure would have on those computing systems, the likelihood of a failure occurring, a subscription amount that customers are paying to use those computing systems (e.g., computing systems for higher paying customers have a higher priority than computing systems for lower paying customers), or some combination thereof. For example, computing systems may have a priority in the range of 1-7, where priority level 1 is higher than priority level 7.

In various embodiments, the ATS obtains the priority information from a centralized database that maintains priority information for a plurality of computing systems in a data center (e.g., priority database 360 in FIG. 3 or priority information system 150 in FIG. 1). In other embodiments, the ATS may communicate with other ATSes to determine its priority relative to other the priorities of other ATSes.

After block 402, the routine 400 continues to block 404, where an existing load on the reserve power system is obtained. In various embodiments, a separate system (e.g., reserve power information 370 in FIG. 3 or priority information system 150 in FIG. 1) may monitor the existing load on the reserve power system. Each ATS contacts or otherwise queries the monitoring system to obtain load information for the reserve power system. In other embodiments, the monitoring system may periodically broadcast the load information.

As indicated above, computing systems or groups of computing systems have a priority assigned to them. In some situations, some specific computing systems or equipment (e.g., emergency systems, storage backup systems, or other systems that an administrator identifies as being the first devices to receive back-up power from the reserve power system) may be identified as critical, which may have the highest priority or be above the highest priority. In some such embodiments, the monitoring system may partition the load of the reserve power system into a reserve partition and a remainder partition. The reserve partition may be selected such that the reserve power system can supply enough power to fully support the identified critical computing systems or equipment. The remainder partition is for other non-critical computing system in the data center. For example, assume that the reserve partition is for 5% of the reserve power system, and no computing systems are currently utilizing the reserve power system, then the monitoring system may indicate that the reserve power system is 5% loaded or 95% available, even though there is currently no load on the reserve power system. In this way, if there is a power failure in the primary power system, the critical computer systems are always guaranteed to have power from the reserve power system.

The load information obtained by the ATS may indicate the existing load on the reserve power system (e.g., the reserve power system is 10% loaded), the reserve partition size and the existing load, a priority threshold value (e.g., computing systems with a priority above 5 can switch to reserve power if needed), or other indication or value of the existing load on the reserve power system.

After block 404, the routine 400 continues to decision block 406 to determine if the existing load on the reserve power system is above a threshold value. In some embodiments, the threshold value may be 0, such that any load on the reserve power system is above the threshold value. In other embodiments, the threshold value may be based on the reserve partition. For example, if the reserve partition is 5%, then the threshold value may be 5%, and the routine determines if the existing load is above the 5% threshold. If the existing load is above the threshold value, the routine continues to decision block 408. In some embodiments, decision block 406 may be optional and not performed.

In decision block 408, the routine 400 determines if the ATS is currently utilizing the reserve power system to supply power to the supported computing systems. If the ATS is currently utilizing the reserve power system, then an event or power failure condition has occurred in the primary power system, and the routine continues to block 410, where the ATS continues to use the reserve power system for the supported computing resources. After which, the routine 400 continues at decision block 428 in FIG. 4B to determine if the primary power system event has ended.

In some embodiments, the ATS may determine if the existing load on the reserve power system changes. If the priority of the supported computing systems is below another threshold based on the new existing load on the reserve power system, then the ATS may switch to and supply power from a backup battery system separate from the primary power system and server power system. So, in some situations, an ATS utilizing the reserve power system may switch to a battery backup system if the load on the reserve power system increases to a threshold that exceeds the priority of the computing systems supported by the ATS. In this way, lower priority computing devices already using the reserve power system can be taken off the reserve power system to make room for other higher priority computing systems to utilize the reserve power system.

If it was determined in decision block 408 that the ATS is not currently utilizing the reserve power system, then the routine continues to decision block 412. In decision block 412, the routine determines if the priority of the supported computing systems is above a threshold value. This threshold value may be different from the threshold value employed in decision block 406. In various embodiments, a priority value that is higher than the threshold value may indicate that the supported computing systems have a higher priority and are thus more important than other computing systems that have a priority value that is lower than the threshold value.

In some embodiments, the threshold value may be static and not change. In other embodiments, the threshold value may be dynamic and can change in real time based on the load of the reserve power system. For example, the routine may receive the priority threshold value from the monitoring system with the load information at block 404. This value may change as the reserve power system becomes more or less loaded. Accordingly, the priority threshold value may increase (e.g., towards higher priority level) if the reserve power system becomes more loaded (e.g., allow only the highest-priority computing systems to utilize reserve power) or decrease (e.g., towards lower priority level) if the reserve power system becomes less loaded (e.g., allow more lower-priority computing systems to utilize reserve power). This priority threshold value is compared to the priority value to determine if the supported computing systems have a priority that is higher or lower than the priority threshold value. If the priority of the supported computing systems is above the threshold value, or if it was instead determined in decision block 406 that the existing load on the reserve power system is below its threshold value, the routine continues to block 416.

In block 416, the ATS identifies the reserve power system as being available for the supported computing systems upon a failure condition or event to the primary power system. In various embodiments, the ATS may store a value indicating that the ATS can switch to the reserve power system.

If instead the priority of the supported computing systems is below the threshold value, then the routine continues to block 414, where the ATS identifies the reserve power system as being unavailable for the supported computing systems upon a failure condition to the primary power system. In various embodiments, the ATS may store a value indicating that the ATS cannot switch to the reserve power system even if it is needed to supply power to the supported computing systems. Since the reserve power system is oversubscribed, as it becomes more loaded, lower-priority computing systems are unable to utilize the reserve power system, which can save power for the higher-priority computing systems.

After the ATS identifies the reserve power system as being available (in block 416) or unavailable (in block 414), the routine 400 continues in decision block 420 in FIG. 4B. In decision block 420, the ATS determines if an event or failure condition has occurred in the primary power system. The failure event may be a complete power failure of the primary power system, a surge or spike in the power, a sagging power supply, or other problems with the primary power system that impact the primary power system's ability to provide consistent power to the supported computing systems. If no event has occurred, the routine 400 continues in block 422, where the ATS continues to use the primary power system to supply power to the supported computing systems. After which, the routine continues to block 432.

If, in decision block 420, a power event has occurred with the primary power system, the routine 400 continues at decision block 424 to determine whether the reserve power system is available to provide power to the supported computing systems. In various embodiments, the ATS utilizes the stored information at blocks 416 and 414 to determine if the ATS can switch to the reserve power system. If so, the routine continues to block 426, where the ATS switches to the reserve power system to supply power from the reserve power system to the supported computing systems.

If on the other hand, that the reserve power system is unavailable, the routine 400 continues in block 440, where the ATS may stop supplying power to the supported computing systems or turn off, power down, or otherwise rest the supported computing systems. Since an event has occurred with primary power system and it is unable to provide sufficient power to the supported computing devices, and since they are too low of a priority to utilize the reserve power system, the ATS can turn off the supported computing devices to save the reserve power system's power for the higher-priority computing devices. In some embodiments, the ATS may rely on a battery backup system that is separate from the primary power system and the reserve power system to supply power to the supported computing systems for at least a limited time.

After blocks 440 or 426, the routine continues to decision block 428 to determine if the event to the primary power system has ended. If so, the routine 400 continues to block 430; otherwise, the routine 400 continues to decision block 442.

In decision block 442, the routine 400 determine whether or not to recheck the existing load on the reserve power system. In some embodiments, the ATS may re-query the monitoring system for the reserve power system load at predetermined time intervals (e.g., once every minute). If the ATS is to recheck the load on the reserve power system, the routine 400 returns to block 404 in FIG. 4A to obtain the existing load on the reserve power system. Otherwise, the routine 400 loops to decision block 428 to determine if the primary power system event has ended.

If the primary power system event has ended, the routine 400 continues to block 430 where the ATS switches back to the primary power system to provide power to the supported computing systems. In those situations where the supported computing systems were turned off because the reserve power system was identified as unavailable, the ATS turns those supported computing systems back on utilizing power from the primary power system.

After block 430 or block 422, the routine continues to block 432 to perform other indicated actions. In some embodiments, the other indicated actions may include obtaining a new priority of the supported computing systems—priority may change based on a change in the actual computing systems coupled to the ATS, changes in the users or customers utilizing the supported computing systems (e.g., higher paying customers are utilizing the supported computing systems), or changes in the total number of computing systems supported by the reserve power system, or other changes in the configuration or arrangement in the computing systems or power systems of the data center.

After block 432, the routine 400 continues at block 404 in FIG. 4A, where the routine obtains a new existing load on the reserve power system. In various embodiments, the existing load on the reserve power system may be once every few seconds, once a minute, or at other times.

Although routine 400 describes checking the priority of the supported computing systems prior to detection of a power failure event in the primary power system, embodiments are not so limited. In other embodiments, the routine may determine if the supported computing system priority is above a priority threshold value in response to a failure in the primary power system. In at least one such embodiment, routine 400 would continue from block 404 to decision block 420, and if an event is detected in the primary power system, the routine 400 would perform embodiments of blocks 404, 406, 408, 410 and 412 instead of block 424. In this way, once a failure is detected (e.g., at block 420), the ATS obtains the existing load on the reserve power system (e.g., as in block 404) and determines if it is above a threshold value (e.g., as in block 406). If so, the ATS determines if it is currently utilizing the reserve power system (e.g., as in block 408)—if so, maintaining to use reserve power (e.g., as in at block 410). If not, the ATS determines if the supported computing systems priority is above a priority threshold value (e.g., as in at block 412)—if it is, then the ATS switches to the reserve power system in block 426; otherwise, the ATS stops supplying power to the supported computing systems in block 440.

It should also be appreciated that in some embodiments the functionality provided by the routines discussed above may be provided in alternative ways, such as being split among more routines or consolidated into fewer routines. Similarly, in some embodiments illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel) and/or in a particular order, those skilled in the art should appreciate that in other embodiments the operations may be performed in other orders and in other manners. Those skilled in the art should also appreciate that the data structures discussed above may be structured in different manners, such as by having a single data structure split into multiple data structures or by having multiple data structures consolidated into a single data structure. Similarly, in some embodiments illustrated data structures may store more or less information than is described, such as when other illustrated data structures instead lack or include such information respectively, or when the amount or types of information that is stored is altered.

From the foregoing it should be appreciated that, although specific embodiments have been described herein for purposes of illustration, various modifications may be made without deviating from the spirit and scope of the invention. Accordingly, the invention is not limited except as by the appended claims and the elements recited therein. In addition, while certain aspects of the invention are presented below in certain claim forms, the inventors contemplate the various aspects of the invention in any available claim form. For example, while only some aspects of the invention may currently be recited as being embodied in a computer-readable medium, other aspects may likewise be so embodied.

What is claimed is:

1. An automatic transfer switch comprising:
    a primary power input coupled to a primary power system capable of powering a plurality of computing systems;

a reserve power input coupled to a reserve power system capable of powering only a subset of the plurality of computing systems;

a power output coupled to a computing system of the plurality of computing systems, wherein the power output supplies power to the computing system from a selectable source that is one of the primary power system or the reserve power system; and a processor that, in response to executing software instructions, causes the automatic transfer switch to:

determine a priority of maintaining power to the computing system;

determine an existing load on the reserve power system; and in response to a problem with the primary power system:

determine, based at least in part on the existing load, that the reserve power system has sufficient capacity to power the computing system; and determine to maintain power to the computing system based on the determined priority and on the determined existing load having the sufficient capacity, and switch the selectable source from the primary power system to the reserve power system.

2. The automatic transfer switch of claim 1 wherein multiple computing systems of the plurality of computing systems are coupled to the power output, and wherein the determined priority is a single priority for the multiple computing systems.

3. The automatic transfer switch of claim 1 wherein the determining of the priority includes retrieving information about the priority from a central source that supplies differing priorities for at least some of the plurality of computing systems based on present uses of the plurality of computing systems.

4. The automatic transfer switch of claim 1 wherein the automatic transfer switch is one of a plurality of automatic transfer switches managing the plurality of computing systems, and wherein the determining of the priority includes exchanging information with multiple automatic transfer switches of the plurality of automatic transfer switches to determine differing priorities for at least some of the plurality of computing systems.

5. The automatic transfer switch of claim 1 wherein the determining to maintain power to the computing system is further based on identifying that the determined priority is above a defined threshold.

6. The automatic transfer switch of claim 5 wherein the determining to maintain power to the computing system is further based on identifying that the existing load is below a second defined threshold.

7. The automatic transfer switch of claim 1 wherein the determining of the existing load on the reserve power system includes monitoring an amount of power being supplied by the reserve power system.

8. A method comprising:

supplying, by an automatic transfer switch, power to an attached computing system from a first power source that is coupled to the automatic transfer switch and that is capable of powering a plurality of computing systems, wherein the automatic transfer switch is also coupled to a second power source capable of powering only a subset of the plurality of computing systems;

determining, by the automatic transfer switch, a priority of the attached computing system;

determining, by the automatic transfer switch, an existing load on the second power source; and if the determined priority is above a threshold that varies based on the determined existing load, supplying, by the automatic transfer switch and after a problem is identified with the first power source, further power to the attached computing system from the second power source, and otherwise powering down the attached computing system after the problem is identified with the first power source.

9. The method of claim 8 wherein the determining of the priority of the attached computing system includes obtaining the priority from a source that maintains respective priorities for each of the plurality of computing systems.

10. The method of claim 8 wherein the determining of the priority of the attached computing system is based on a type of a program being executed on the attached computing system or a user on whose behalf the program is being executed on the attached computing system.

11. The method of claim 8 further comprising increasing the threshold as the existing load increases, identifying the problem with the first power source, and identifying, by the automatic transfer switch and in response to the identifying of the problem, that the determined priority exceeds the threshold.

12. The method of claim 8 wherein the determining of the existing load on the second power source includes obtaining information about the existing load from a system that monitors use of the second power source.

13. The method of claim 8 wherein the plurality of computing systems include a plurality of co-located computing systems that are part of a data center, and wherein the automatic transfer switch is one of multiple automatic transfer switches in the data center managing power to the plurality of co-located computing systems.

14. The method of claim 13 wherein the first power source is a primary source supplied to the data center from an external supplier, and wherein the second power source is a reserve power source from a generator system at the data center that is configured to supply power for a subset of the data center.

15. The method of claim 14 further comprising determining, by the automatic transfer switch the determined priority is above the threshold, and further supplying additional power to the computing system from a backup battery system separate from the first and second power sources.

16. The method of claim 8 further comprising determining, by the automatic transfer switch the determined priority is below the threshold, and performing the powering down of the attached computing system.

17. A system comprising:

a plurality of computing systems located in a data center;

one or more storage systems in the data center with stored information about respective specified priorities for at least some of the plurality of computing systems;

a primary power system that is capable of supplying power to all of the plurality of computing systems;

a secondary power system for the data center that is capable of supplying power to only a subset of the plurality of computing systems; and multiple automatic transfer switches in the data center to manage power being supplied to the plurality of computing systems, the multiple automatic transfer switches including a first automatic transfer switch coupled to a first subset of the plurality of computing systems and with circuitry configured to:

determine, prior to a problem occurring at the first automatic transfer switch with power being supplied by the primary power system, how to manage the problem, including:
- obtaining information regarding an existing load on the secondary power system;
- obtaining, from the one or more storage systems, information regarding a first specified priority of the first subset of computing systems; and
- determining, based on the first specified priority of the first subset of computing systems and on the existing load on the secondary power system, to switch power being supplied to the first subset of computing systems from the primary power system to the secondary power system if the problem occurs; and in response to the problem occurring, and based at least in part on the determining how to manage the problem prior to the problem occurring, switch the power being supplied to the first subset of computing systems from the primary power system to the secondary power system.

18. The system of claim 17 wherein the primary power system comprises a utility power feed, wherein the problem that occurs at the first automatic transfer switch is caused by a failure in the utility power feed, and wherein the multiple automatic transfer switches further include a second automatic transfer switch coupled to a second subset of the plurality of computing systems and with circuitry configured to:
- obtain information regarding the existing load on the secondary power system;
- obtain, from the one or more storage systems, information regarding a second specified priority of the second subset of computing systems that is lower than the first specified priority of the first subset of computing systems; and
- in response to the failure in the utility power feed, determine, based on the existing load on the secondary power system and on the lower second specified priority of the second subset of computing systems, to power down the second subset of computing systems.

19. The system of claim 18 wherein the first subset of computing systems are located on a first rack in the data center to which the first automatic transfer switch supplies power, and wherein the second subset of computing systems are located on a second rack in the data center to which the second automatic transfer switch supplies power.

20. The system of claim 18 wherein the first subset of computing systems and the second subset of computing systems are co-located on a single rack, and wherein the first automatic transfer switch supplies power to the first subset of computing systems independently of the second automatic transfer switch supplying power to the second subset of computing systems.

21. The system of claim 17 wherein the determining how to manage the problem occurs at a first time and includes identifying the first specified priority of the first subset of computing systems and the existing load on the secondary power system as each being applicable for the first time, and wherein the multiple automatic transfer switches further include a second automatic transfer switch coupled to a second subset of the plurality of computing systems and configured to:
- determine a second priority of the second subset of computing systems at a second time later than the first time, wherein the second priority is determined to be the same as the first specified priority of the first subset of computing systems for the first time,
- obtain information regarding a second load existing on the secondary power system at the second time, wherein the second load is determined to be higher than the existing load for the first time, and
- in response to a second problem with power being supplied to the second subset of computing systems from the primary power system at the second time, determine, based on the higher second load causing a priority threshold to increase above the second priority of the second subset of computing systems, to power down the second subset of computing systems.

* * * * *

UNITED STATES PATENT AND TRADEMARK OFFICE
CERTIFICATE OF CORRECTION

PATENT NO. : 10,175,737 B1
APPLICATION NO. : 14/979215
DATED : January 8, 2019
INVENTOR(S) : Yuan Kong et al.

Page 1 of 1

It is certified that error appears in the above-identified patent and that said Letters Patent is hereby corrected as shown below:

In the Claims

Column 16, Lines 43-45:
"further comprising determining, by the automatic transfer switch the determined priority is above the threshold," should read, --further comprising determining, by the automatic transfer switch, that the determined priority is above the threshold,--.

Column 16, Lines 48-50:
"further comprising determining, by the automatic transfer switch the determined priority is below the threshold," should read, --further comprising determining, by the automatic transfer switch, that the determined priority is below the threshold,--.

Signed and Sealed this
Nineteenth Day of March, 2019

Andrei Iancu
*Director of the United States Patent and Trademark Office*